US006919165B2

(12) United States Patent
Calderon

(10) Patent No.: US 6,919,165 B2
(45) Date of Patent: Jul. 19, 2005

(54) IMAGING AND ERASING OF A PRINTING FORM MADE OF POLYMER MATERIAL CONTAINING IMIDE GROUPS

(75) Inventor: Joaquin Barrera Calderon, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 88 days.

(21) Appl. No.: 10/122,817

(22) Filed: Apr. 15, 2002

(65) Prior Publication Data

US 2002/0177053 A1 Nov. 28, 2002

(30) Foreign Application Priority Data

May 3, 2001 (DE) ........................................ 101 21 561

(51) Int. Cl.$^{7}$ ............................ G03F 7/26; B41C 1/10; B41N 3/03

(52) U.S. Cl. ......................... 430/302; 430/309; 430/19; 101/465; 101/466; 101/467

(58) Field of Search ................................ 430/302, 309, 430/19; 101/465, 466, 467

(56) References Cited

U.S. PATENT DOCUMENTS

| | | | | |
|---|---|---|---|---|
| 4,568,632 A | | 2/1986 | Blum et al. | 430/322 |
| 4,634,659 A | | 1/1987 | Esumi et al. | 430/302 |
| 4,693,958 A | * | 9/1987 | Schwartz et al. | 430/302 |
| 4,999,251 A | * | 3/1991 | Foust et al. | 428/458 |
| 5,288,519 A | * | 2/1994 | Baumgartner et al. | 427/304 |
| 6,162,578 A | | 12/2000 | Zheng et al. | 430/270.1 |
| 6,318,264 B1 | | 11/2001 | D'Heureuse et al. | 101/476 |

FOREIGN PATENT DOCUMENTS

| | | | | |
|---|---|---|---|---|
| DE | 103 977 | | 2/1974 | |
| DE | 69130607 | | 12/1998 | |
| DE | 19959633 | | 6/2000 | |
| DE | 10042293 | | 3/2001 | |
| EP | 0 743 177 | | 11/1996 | |
| EP | 0 872 339 | | 10/1998 | |
| EP | 0521904 | | 12/1998 | |
| EP | 0911154 | | 4/1999 | |
| JP | 04 193956 | | 11/1990 | |
| JP | 4-356387 A | * | 10/1992 | B26K/26/00 |
| JP | 7-266076 A | * | 10/1996 | B23K/26/16 |

OTHER PUBLICATIONS

Yamazaki Akio et al, English Machine translation of JP 07–266076 from Japan Patent Office, copyright 2000 , 11 pages.*

124:89419 CA, Chemical Abstracts of JP 07266076 A2, issued Oct. 10, 1995, one page.*

Derwent –Acc–No: 1995–389250, Derwent—Week: 200333, Copyrignt 1999 Derwent Informatioin LTD, English abstract of JP 07266076A, 2 pages.*

Yamazaki et al, Pat–No: JP407266076A, copyright 1995, JPO, one page.*

(Continued)

*Primary Examiner*—Cynthia Hamilton
(74) *Attorney, Agent, or Firm*—Davidson, Davidson & Kappel, LLC

(57) ABSTRACT

A method for producing a pattern of hydrophilic (34) and hydrophobic (32) regions on a printing form (30) is presented which, in a first, essentially unpatterned state, features a polymer material containing imide groups, for example, polybenzene diimide or polyamide imide. The method includes a chemical treatment of the surface with an oxidizing agent subsequent in time to a locally selective exposure with UV light. Optionally, the locally selective exposure can be preceded by a large-area chemical treatment of the surface with a strong base. The printing form (30) can be restored to the first state by a large-area chemical treatment of the surface with a strong acid. The patterned printing form (30) is suitable for use in offset printing.

10 Claims, 4 Drawing Sheets

OTHER PUBLICATIONS

Derwent –Acc–No: 1993–030456 Week: 199304, Copyrignt 1999 Derwent Informatioin LTD, English abstract of JP JP 04356387A, 2 pages.*

Arieli, Rami, The Laser Adventure: The "Virtual School" about "Lasers and their Applications", at www.phys.ksu.edu/perg/vpq/laserweb, Glossary of laser definitions, 6 pages and Chapter 6.1.8, Exminer lasers p. 2.*

* cited by examiner

IMAGING AND ERASING OF A PRINTING FORM MADE OF POLYMER MATERIAL CONTAINING IMIDE GROUPS

Priority to German Patent Application No. 101 21 561.04, filed May 3, 2001 and hereby incorporated by reference herein, is claimed.

BACKGROUND INFORMATION

The present invention relates to a method for producing a pattern of hydrophilic and hydrophobic regions on a surface which, in a first, essentially unpatterned state, features a polymer material containing imide groups. Moreover, the present invention relates to a printing form, in particular, for use as printing form in offset printing, featuring a surface for printing.

To express it in simplified terms, lithographic printing is based on making use of the immiscibility of oil and water on a surface, the so-called "printing form", the image-forming regions retaining the lipophilic (hydrophobic) solution or the ink or color and the non-image forming regions of the printing surface retaining the water or the hydrophilic solution. When the printing surface, which has been prepared in a suitable manner, is wetted with hydrophilic and lipophilic substances or solutions, in particular water and ink or color, then the non-image regions preferably retain the hydrophilic substance or solution and repel the lipophilic substances while the image regions take up the lipophilic solution or ink or color and repel the hydrophilic substances. Consequently, the lipophilic substance is then transferred in a suitable manner onto the surface of a material on which to fix the image, for example, paper, cloth, polymers, or the like.

For many years, aluminum has been used as material for printing forms. Usually, the aluminum is initially subjected to a graining process and then to a subsequent anodizing process. The anodization serves to provide an oxide layer whose adherence is improved by the granularity. The granularity boosts the hydrophilic properties of the background of the printing plate. In the anodizing process, usually a strong acid, such as sulfuric or phosphoric acid, is used to subsequently make the surface hydrophilic by a further process such as in a thermal siliconization process or the so-called "electrosiliconization".

To produce an above described printing form, a large number of radiation-sensitive materials are known which, in the use of the lithographic printing method, are suitable for generating images in that they provide an image region which is usable for printing upon exposure and possibly required development and fixation. For this purpose, it is possible to use, for example, photopolymerizable substances.

The above described arrangement is subjected to an imaging exposure by supplying energy in a locally selective manner. This can be accomplished by exposure with UV light through a mask, or else by direct writing with a laser.

The lithographic printing forms of the type described above are usually treated with a developer solution which typically is an aqueous alkaline or basic solution containing organic additives.

For some time, efforts have been made to produce printing forms in connection with which a wet chemical developing method for producing the image can be dispensed with. To this end, it is possible to use oxide ceramics which exist, for example, in the form of coatings on a printing plate.

In European Patent Application EP 0 911 154 A1, the materials proposed for the plate surface are titanium dioxide ($TiO_2$) and zirconium dioxide ($ZnO_2$) which can be both pure or mixed with other metallic additives in different ratios. In the non-excited state, this surface is hydrophobic and capable of being transformed into a hydrophilic state by irradiation with ultraviolet light. The imaging is now accomplished in that the entire surface of the plate is illuminated with ultraviolet light and regions which are intended to carry ink during printing are covered with a mask or a film.

At least when using titanium dioxide layers as substrate, it turns out to be particularly disadvantageous that the titanium dioxide layers can indeed be switched with UV light but have a low stability with respect to the time characteristic of the switching. In the case of titanium dioxide layers, moreover, it turns out again and again that a sufficient switching or a sufficient shift, i.e., a sufficient flip from hydrophilic to hydrophobic is achievable only with inadequate intensity. Furthermore, the complete cleaning of the substrate upon the completion of the printing represents a problem in practice which is not to be underestimated.

U.S. Pat. No. 4,568,632 describes the patterning of polymer surfaces or polymer films containing at least one imide group in the corresponding monomer, whether in the main chain or a side chain of the polymer composed thereof. It discloses a method for etching or removing polyimide without chemical treatment steps. The polyimide is exposed to ultraviolet light having a wavelength shorter than 220 nm, for example, from an argon fluoride excimer laser so that a photocatalytic decomposition takes place during which volatile products are removed by suitable means. To support, in particular, to accelerate the process, the reaction is carried out in an atmosphere which contains oxygen. A patterning can be achieved, for example, by using a mask which is illuminated over a large area or by scanning the surface with an exposure beam for a spatially selective reaction. This patterning can be accomplished without significantly influencing the polyimide which remains at the surface. Therefore, a patterning of the surface into hydrophobic and hydrophilic regions which, in particular, would allow the patterned surface to be used for the printing process according to a lithographic method or an offset method cannot be achieved.

SUMMARY OF THE INVENTION

Against the background of this related art, an object of the present invention is to propose a stable and easily switchable surface for printing processes.

The present invention provides a method for producing a pattern of hydrophilic (34) and hydrophobic (32) regions on a surface which, in a first, essentially unpatterned state, features a polymer material containing imide groups. The method is characterized by a chemical treatment of the surface with an oxidizing agent subsequent in time to a locally selective exposure by local irradiation of electromagnetic energy. Also provided is a printing form (30), in particular, for use as a printing form (30) in offset printing, comprising a surface for printing, wherein the surface features a polymer material containing imide groups.

According to the present invention, the hydrophobic and hydrophilic regions required for the lithographic printing process are produced on a polyimide surface by imaging or patterning it, possibly upon chemical initialization, in that the imaging is carried out using electromagnetic radiation and completed by a further chemical reaction. Once the printing is completed, it is possible for the imaged pattern to be erased by a further chemical reaction.

Via the method according the present invention, a printing form is provided which can be used for printing in a conventional wet offset method. Moreover, the printing form according the present invention is also suitable for printing using an additive-free damping agent such as pure water, i.e., for example, without the commonly used isopropanol.

It is particularly advantageous that the patterned polyimide surface can be erased through a further chemical process. In other words: The method according to the present invention provides a surface which is writable in a reversible manner and capable of being erased again.

In the context of the method and printing form according to the present invention, polyimide will be understood as a polymer material whose appertaining monomer includes the functional group of an imide.

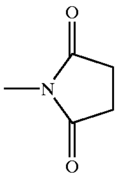

In this connection, this group can occur in the main chain or a side chain of the polyimide. In a first preferred embodiment of the present invention, polybenzene diimide

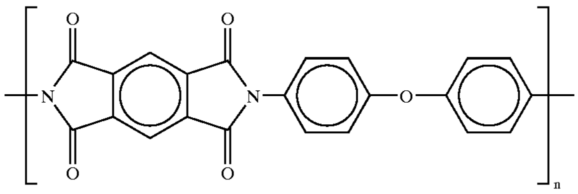

which will hereinafter be abbreviated as PBDI, is used as the polyimide. This substance is marketed under the name of KAPTON by Dupont. In a second embodiment, so-called "polyamide imide" (abbreviated as PAI)

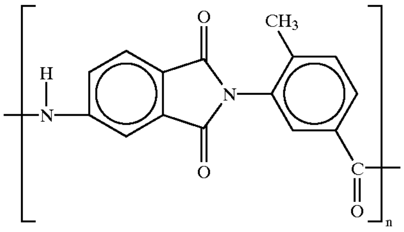

is employed and abbreviated as the polyimid.

In the context of the present invention, the physical behavior of the polyimides is essentially identical. The embodiments which are specified in detail represent only examples. The method according to the present invention can also be employed using other substances containing imide groups. In the original state, the polymer used is highly hydrophobic and, consequently, carries color well.

The method according to the present invention for producing a pattern of hydropbilic and hydrophobic regions on a surface which, in a first, essentially unpatterned state, features a polymer material containing imide groups has the feature that a chemical treatment of the surface with an oxidizing agent is carried out subsequent in time to a locally selective exposure by local irradiation of electromagnetic energy. The electromagnetic energy is preferably produced by a UV light source which emits light having a wavelength of between 200 and 440 nm, preferably 220 and 460 nm. Hydrogen peroxide ($H_2O_2$), oxygen ($O_2$), ozone ($O_3$) or potassium permanganate ($KMnO_4$), or a combination of these oxidizing agents can be preferably used as oxidizing agent. In the temporally subsequent chemical treatment, a liquid containing ionic surfactants can also be used besides the oxidizing agent. It is possible to carry out a large-area chemical treatment of the surface with a strong base in addition to and prior in time to the locally selective exposure. Preferably, the strong base is an aqueous solution of potassium hydroxide (KOH) and/or sodium hydroxide (NaOH).

Via an additional, temporally subsequent method step, it is possible to transform the surface into the first, essentially unpatterned state. To this end, the surface is chemically treated with a strong acid over a large area. Preferably, the strong acid is an aqueous solution of sulfuric acid ($H_2SO_4$) and/or hydrochloric acid (HCl) and/or nitric acid ($HNO_3$) and/or the like. The large-area chemical treatment of the surface can be carried out, for instance, using a suitable corresponding plate cleaner. By restoring the surface to the first, essentially unpatterned state, it is possible for the method steps to be iterated. In other words: it is possible to rewrite the surface with patterns of changing topography.

A printing form according to the present invention which is suitable, in particular, for use as printing form in offset printing includes a surface for printing which features a polymer material containing imide groups, preferably PBDI or PAI. A surface of that kind can be patterned using the method according to the present invention, in particular, including the individual options described above. Thus, a rewritable printing form is provided by the present invention.

The printing form according to the present invention can be used in a particularly advantageous manner in a printing unit or a printing machine. It is a feature of such a printing unit that it is provided with a printing form according to the present invention for printing. A printing machine, in particular, an offset printing press, having at least one feeder, one printing unit and one delivery then features at least one printing unit which is provided with a printing form according to the present invention for printing.

BRIEF DESCRIPTION OF THE DRAWINGS

Further advantages as well as expedient embodiments and refinements of the present invention will be depicted by way of the following Figures and the descriptions thereof. Specifically shown are in FIG. 1 a flow chart of the method according to the present invention including a chemical initialization step which includes a treatment with a basic substance.

DETAILED DESCRIPTION

Figure 1:
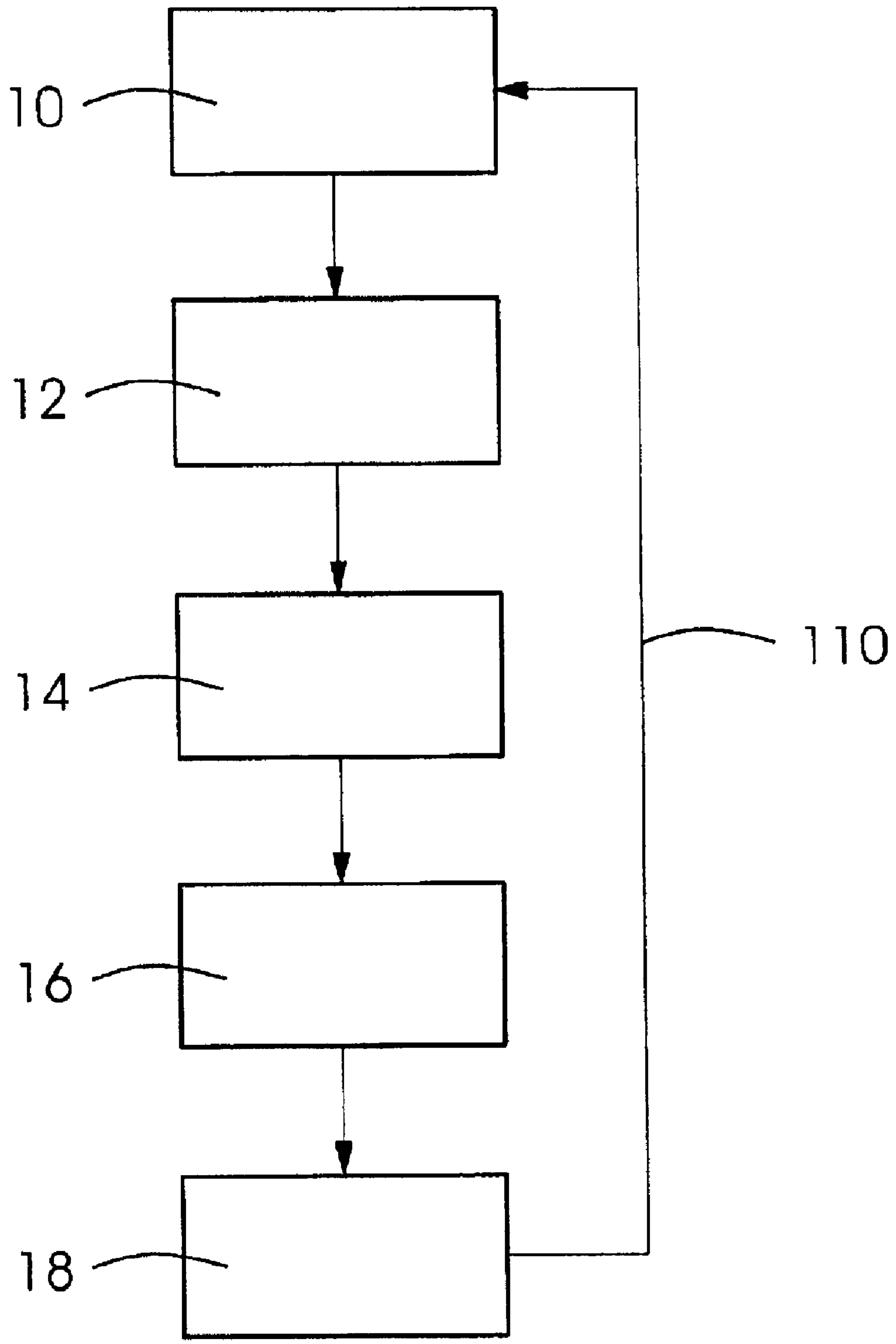

FIG. 1 shows a flow chart of the method according to the present invention including a chemical initialization step which includes a treatment with a basic substance. The flow chart serves to illustrate the individual method steps and their order. The polymer material used in the method according to the present invention is a substance which, in the first, original state, is highly hydrophobic and, at the same time, therefore, carries color well.

The polymer material is subjected to a base treatment 10. For instance, it is exposed to an aqueous solution of a strong base such as potassium hydroxide or sodium hydroxide for a certain time interval in the range of minutes. This treatment makes the polymer material hydrophilic. Thus, a large-area base treatment 10 makes the surface hydrophilic over a large area. The actual patterning is carried out in this state: The color-carrying and the non-color carrying regions, that is, image areas and non-image areas are defined. A local exposure 12 is carried out by electromagnetic radiation, preferably in the UV range. An oxidation 14 follows as the next step. The oxidizing agent, for example, hydrogen peroxide, potassium permanganate, or the like, switches or develops the property of the surface which was exposed to the electromagnetic radiation. In other words: regions which were hydrophilic prior to exposure 12 and subsequent oxidation 14, become hydrophobic now. Optionally, the surface is treated with a polysaccharide or polysaccharide mixture, preferably D-arabinose and/or D-fructose subsequent to the oxidation process. This additional, optional step improves stabilization of the hydrophobic and hydrophilic regions, respectively. The thus patterned surface is now ready for printing. Subsequent to printing 16, the patterning of the surface can be erased through an acid treatment 18. To this end, the surface is exposed to a strong acid over a large area, for example, to an aqueous solution of sulfuric acid, hydrochloric acid, nitric acid, or the like, or to plate cleaner. Due to this method step, the surface is hydrophobic again. It is possible to carry out an iteration 110 of the specified sequence of method steps. During a new local exposure 12, it is possible to produce a pattern having another, generally different topography on the surface.

Figure 2:
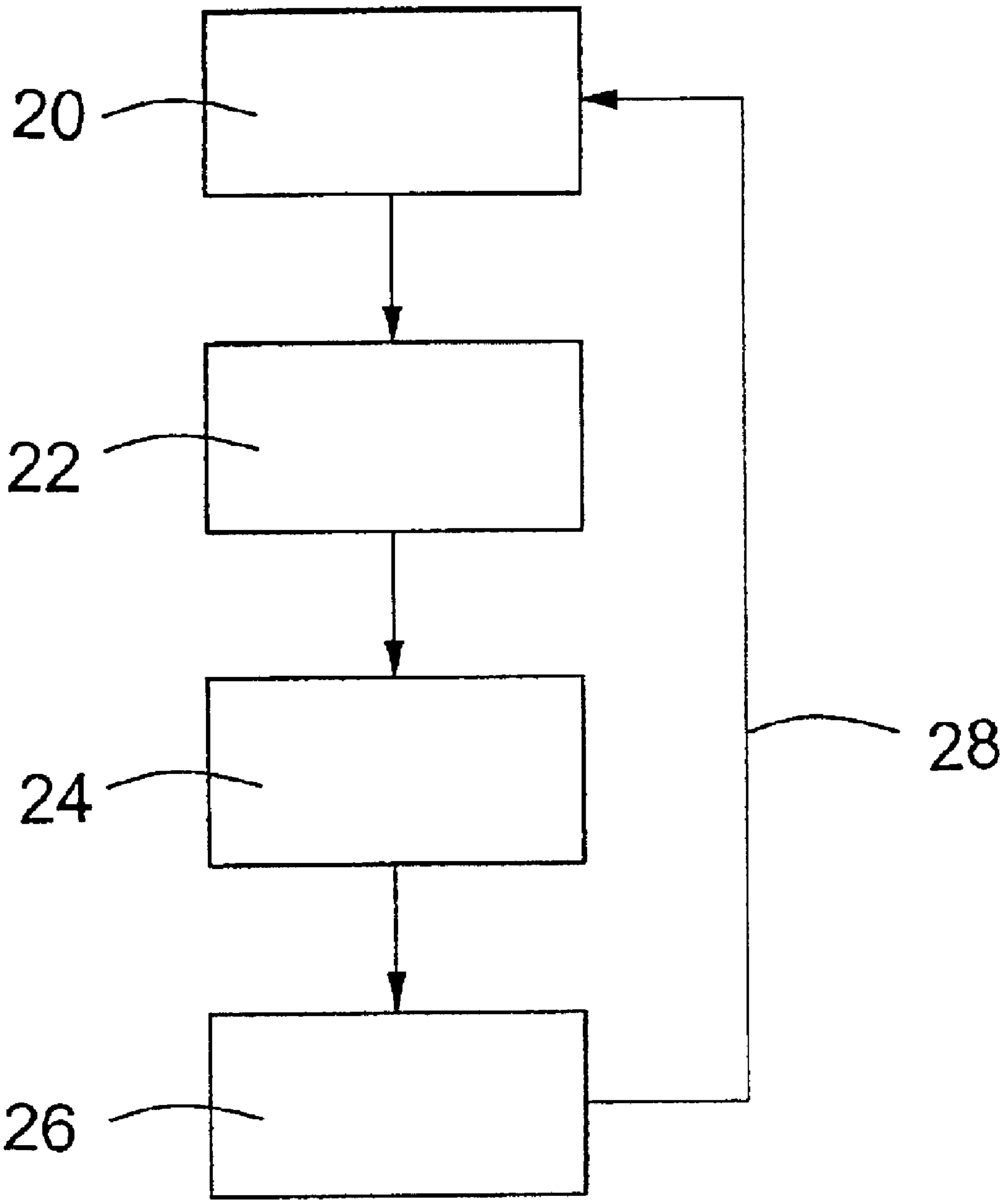
FIG. 2 a flow chart of the method according to the present invention including direct patterning of the polyimide surface by electromagnetic radiation.

FIG. 2 is a flow chart of the method according to the present invention including direct patterning of the polyimide surface by electromagnetic radiation. This flow chart serves to illustrate the individual method steps and their order. In this embodiment of the method according to the present invention, the polymer material used which is in a first, originally hydrophobic state is subjected to a local exposure 20. Via temporally subsequent oxidation 22, a patterning is achieved: The regions which have been exposed to light in a locally limited manner are hydrophilic now. The thus patterned surface can be used for printing 24. Via an acid treatment 26, it is possible to erase the pattern of hydrophilic and hydrophobic regions. The surface is transformed into the first, hydrophobic state through acid treatment 26. Thus, it is possible again to carry out an iteration 28 of the steps of the method according to the present invention.

Figure 3:
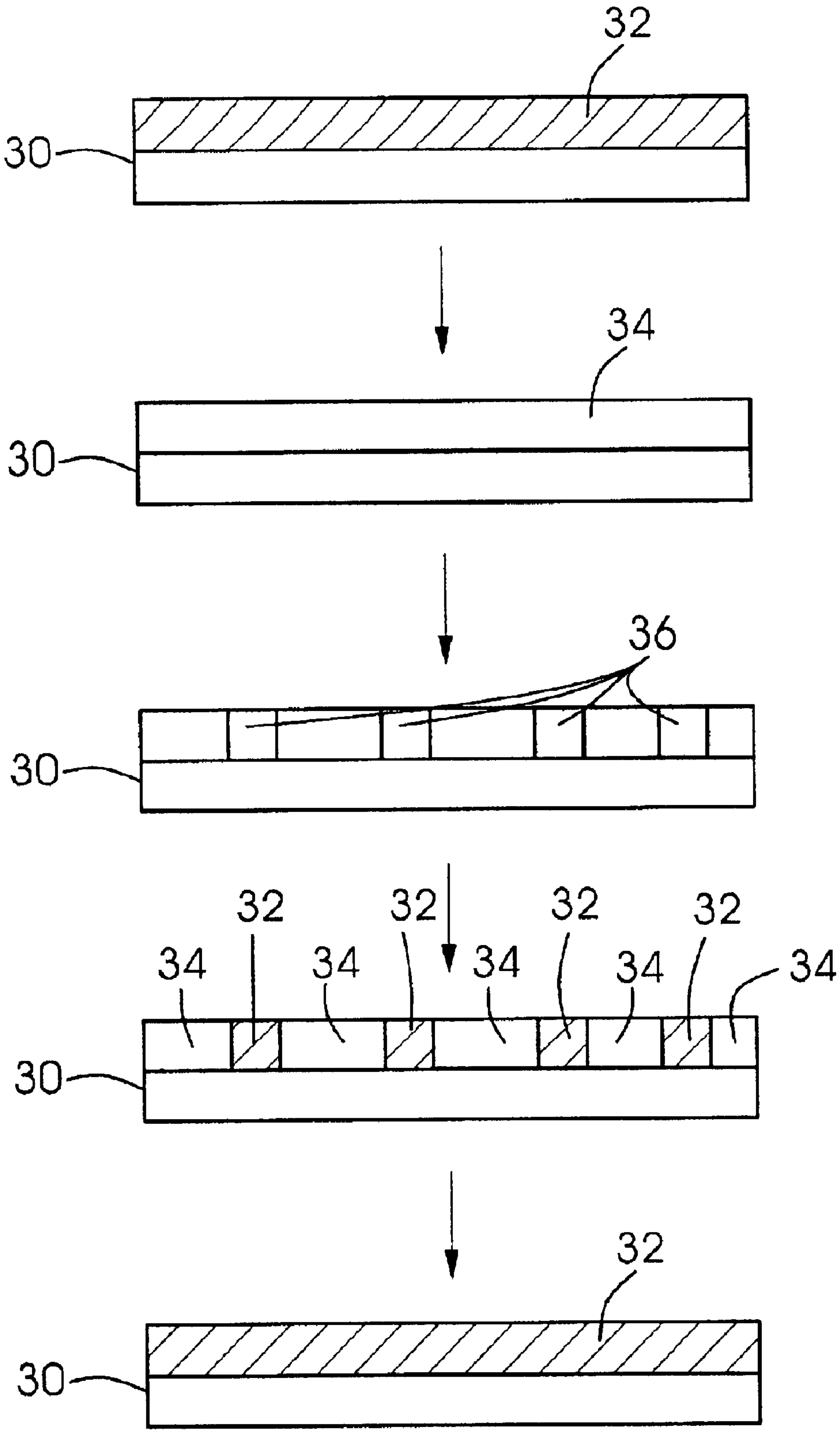
FIG. 3 a schematic representation of the patterning of a printing form whose surface features polyimide using the method according to the present invention, including a chemical initialization step.

FIG. 3 a schematic representation of the patterning of a printing form whose surface features polyimide using the method according to the present invention, including a chemical initialization step. FIG. 3 shows five states of printing form 30 in the temporal order indicated by the arrows. Initially, printing form 30 has a surface which constitutes a large-area hydrophobic region 32. Via a chemical initialization step of treating the surface with a strong base, the surface is converted into a hydrophilic region 34 over a large area. By selective exposure, initialized regions of a first type 36 are produced in a locally limited manner on surface 34 which is hydrophilic over a large area. Via the subsequent oxidation, hydrophobic regions 32 are formed next to hydrophilic regions 34. Thus, a patterning of the surface of printing form 30 is achieved. This pattern can be erased by subjecting printing form 30 to an acid treatment over a large surface. Subsequent to this step, printing form 30 has a large-area hydrophobic region 32 again.

Thus, an exemplary embodiment of the method according to the present invention is described as follows:

The polymer material, preferably PBDI or PAI, is applied to a suitable carrier, for example, to an aluminum plate, in a thickness between a still manipulable foil of approximately 25 micrometers up to a layer thickness of several millimeters. The surface of the applied polymer material is subsequently subjected to a base treatment, it being preferred to use sodium hydroxide (NaOH) and/or potassium hydroxide (KOH). With regard to the concentrations, for example, in the case of sodium hydroxide, 0.5 to 1 molar solutions are used, in connection with which it remains to be observed that excessive concentrations (of an about 5 molar solution) can damage the polymer material. The polymer material, which originally was completely hydrophobic in its first state, is essentially completely hydrophilized by the base treatment whose duration is in the range of several minutes, preferably approximately one minute. Subsequently, the imaging takes place either through a mask or by locally selective illumination using a light beam which is locally directed onto the printing surface. It is preferred to use a UV laser as light source. The locally selective exposure is to be regarded as an initialization reaction which is followed by a chemical treatment of the surface. The surface which has been exposed to light is subsequently subjected to an oxidizing agent such as hydrogen peroxide ($H_2O_2$), oxygen or ozone. Moreover, it is also possible to use potassium permanganate ($KMnO_4$) in the liquid phase. The preferred concentration of hydrogen peroxide is a 15% solution of hydrogen peroxide in water. In the case of potassium permanganate, it is preferred to use a 0.02 molar solution in water. Through the treatment with an oxidizing agent, the regions which have previously been locally irradiated become hydrophobic while the remaining regions remain hydrophilic. For improved stabilization of the hydrophobic and hydrophilic regions, respectively, it is advantageous to additionally subject the surface to a treatment, i.e., to a so-called "gumming" with a polysaccharide.

The polymer printing form produced in this manner is used for printing. Subsequent to printing, the printing form can be erased and cleaned at the same time, it being actually possible to employ all usual, known mechanical ways of cleaning: The surface is subjected to a strong acid, for example, sulfuric acid ($H_2SO_4$), hydrochloric acid (HCl) or nitric acid ($HNO_3$). In this context, the acids should preferably be in a concentration of a 1 molar solution.

If necessary, it is also possible to use a chemical cleaning agent, in particular, a commercial plate cleaner, to assist a mechanical cleaning process. Subsequently, the entire imaging process can be repeated for a new printing process.

Figure 4:
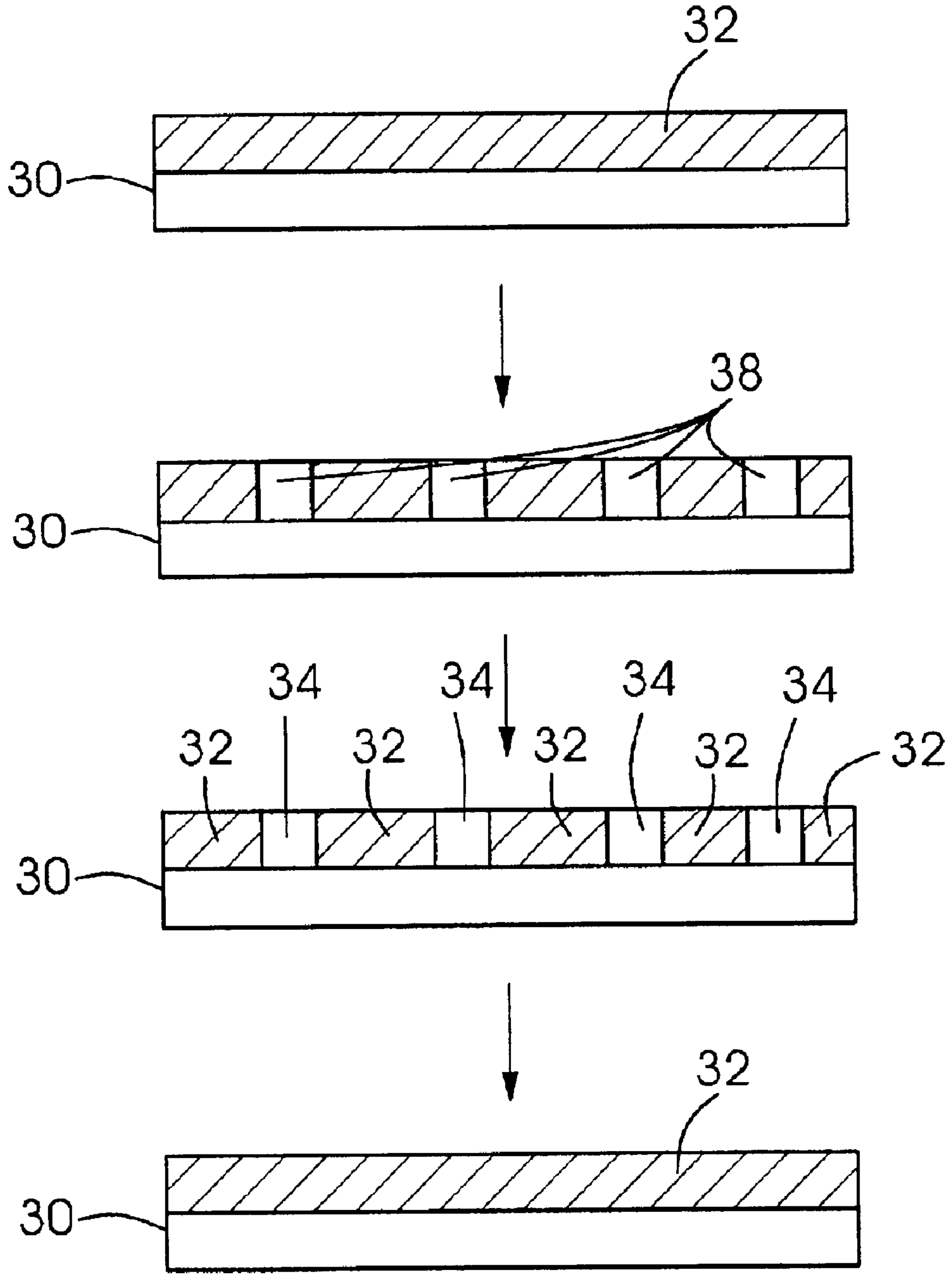
FIG. 4 a schematic representation of the patterning of a printing form whose surface features polyimide using the method according to the present invention, without chemical initialization step through treatment with a basic substance.

FIG. 4 is a schematic representation of the patterning of a printing form whose surface features polyimide using the method according to the present invention, without chemical initialization step through treatment with a basic substance.

FIG. 4 shows four states of printing form 30 whose temporal order is indicated by the arrows. Initially, printing form 30 has a large-area hydrophobic region 32. By local exposure, in particular, using a UV light source, initialized regions of a second type 38 are produced on the surface of printing form 30. These are converted into hydrophilic regions 34 by oxidation. Thus, the surface has a pattern of hydrophobic regions 32 and hydrophilic regions 34 so that it can be used for printing. Upon treatment of the surface of printing form 30 with a strong acid over a large area, it is achieved that the printing form is hydrophobic over a large area again.

To express it in other words: Without base treatment 10, as shown in the flow chart of FIG. 1, the process of locally selective exposure by local irradiation of electromagnetic energy described with reference to FIG. 4 results in an inverse hydrophilization or hydrophobization result, respectively, when the printing form is subjected to a temporally subsequent chemical treatment with an oxidizing agent.

It should further be observed that it is particularly advantageous that soap waters are usable as damping agent for offset printing with the printing form according to the present invention. The surfactants in the water make the imaged regions appear more sharply set off upon printing.

The printing form may be attached to or part of a cylinder in a print unit. A print unit of this kind may constitute part of a printing press, for example as in the printing press in U.S. Pat. No. 6,318,264, which is hereby incorporated by reference herein.

LIST OF REFERENCE NUMERALS

10 base treatment
12 local exposure
14 oxidation
16 printing
18 acid treatment
110 iteration
20 local exposure
22 oxidation
24 printing
26 acid treatment
28 iteration
30 printing form
32 hydrophobic region
34 hydrophilic region
36 initialized region of the first type
38 initialized region of the second type

What is claimed is:

1. A method for producing a pattern of hydrophilic and hydrophobic regions on a surface of a printing form having a first unpatterned state, comprising the steps of:

providing a surface of a printing form including a polymer material containing imide groups;

locally selectively exposing the surface by local irradation of electromagnetic energy; and chemically treating the surface with an oxidizing agent subsequent in time to locally selective exposure so that a pattern of hydrophilic and hydrophobic regions on the surface is formed, the surface in the patterned state being capable for offset printing.

2. The method as recited in claim 1, further comprising chemically treating the surface with a base before the locally selective exposure.

3. The method as recited in claim 1, further comprising chemically treating the surface with an acid subsequent to the chemically treating the surface with the oxidizing agent, so as to transform the surface into the first unpatterned state.

4. The method as recited in claim 1, wherein the electromagnetic energy is produced by a UV light source emitting light having a wavelength of between 200 and 440 nm.

5. The method as recited in claim 1, wherein the oxidizing agent contains at least one of hydrogen peroxide ($H_2O_2$), oxygen ($O_2$), ozone ($O_3$) and potassium permanganate ($KMnO_4$).

6. The method as recited in claim 2, wherein the base includes an aqueous solution including at least one of potassium hydroxide (KOH) and sodium hydroxide (NaOH).

7. The method as recited in claim 3, wherein the acid is an aqueous solution including at least one of sulfuric acid ($H_2SO_4$), hydrochloric acid (HCl) and nitric acid ($HNO_3$).

8. The method as recited in claim 1, wherein the chemically treating step includes exposure to, besides the oxidizing agent, a liquid containing ionic surfactants.

9. The method as recited in claim 1 wherein the polymer material containing imide groups is PBDI or PAI.

10. The method as recited in claim 1, further comprising bringing the surface into contact with a polysaccharide subsequent in time to the chemical treatment of the surface with the oxidizing agent.

* * * * *